(12) United States Patent  
Okoroanyanwu et al.

(10) Patent No.: US 7,012,013 B1  
(45) Date of Patent: Mar. 14, 2006

(54) DIELECTRIC PATTERN FORMATION FOR ORGANIC ELECTRONIC DEVICES

(75) Inventors: Uzodinma Okoroanyanwu, Mountain View, CA (US); Nicolay F. Yudanov, Brookline, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 201 days.

(21) Appl. No.: 10/726,868

(22) Filed: Dec. 3, 2003

(51) Int. Cl.  
*H01L 21/20* (2006.01)

(52) U.S. Cl. .................................... 438/584
(58) Field of Classification Search ............... 438/584  
See application file for complete search history.

(56) References Cited

U.S. PATENT DOCUMENTS

| | | | |
|---|---|---|---|
| 5,689,428 A * | 11/1997 | Sauerbrey et al. | 702/60 |
| 6,867,081 B1 * | 3/2005 | Weng et al. | 438/197 |
| 6,927,108 B1 * | 8/2005 | Weng et al. | 438/164 |

OTHER PUBLICATIONS

Kaplan et al., "Optical and Electrical Properties of Ion—Beam—Irradiated Films of organic Molecular Solids and Polymers", J. Appl. Phys. vol. 55 (3), p. 732-42 (1984).*

Jung et al., "Modification of Coducting Polymers by Low Energy Reactive Ion Beams and Their Chemical effects", Nuclear Instruments & methods in Physics Research, Section B, vol. B 80-81, Pt. 2, p. 1076-9 (1993).*

* cited by examiner

*Primary Examiner*—Asok Kumar Sarkar  
(74) *Attorney, Agent, or Firm*—Amin & Turocy, LLP

(57) ABSTRACT

Methods and systems are provided for patterning a non conductive dielectric on a surface of a conductive polymer. The conductive polymer can be part of an organic memory cell. Hydrogen ions created form molecular hydrogen being exposed to short wave length radiation, are employed as mobile positive ion charge carriers to create a non-conductive die-electric pattern on a conductive and/or semiconductive polymer surface of the organic memory cell. Such process reduces number of masking steps performed. In addition, the process is scalable with lithographic wave length and can be performed on wide spread tool sets and photoresist material available in commercial market.

16 Claims, 16 Drawing Sheets

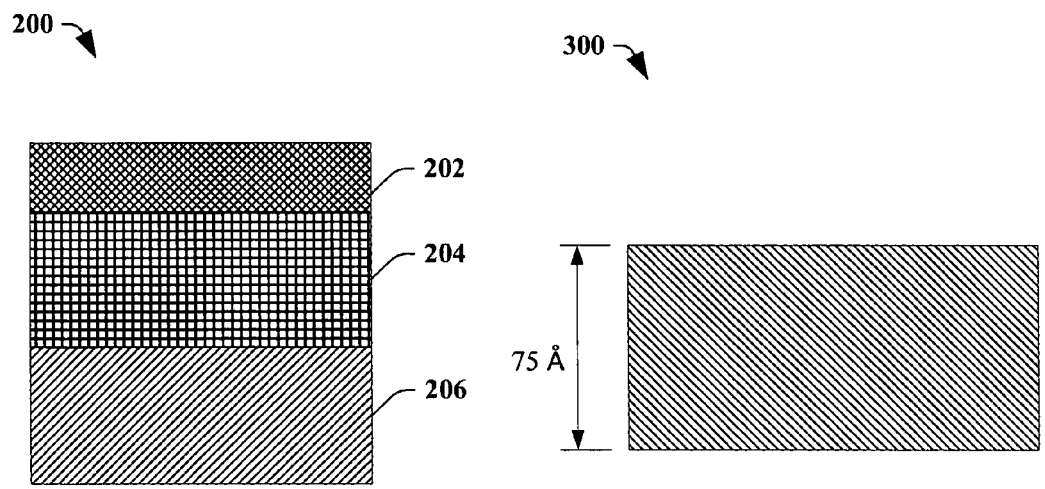
FIG. 2   FIG. 3
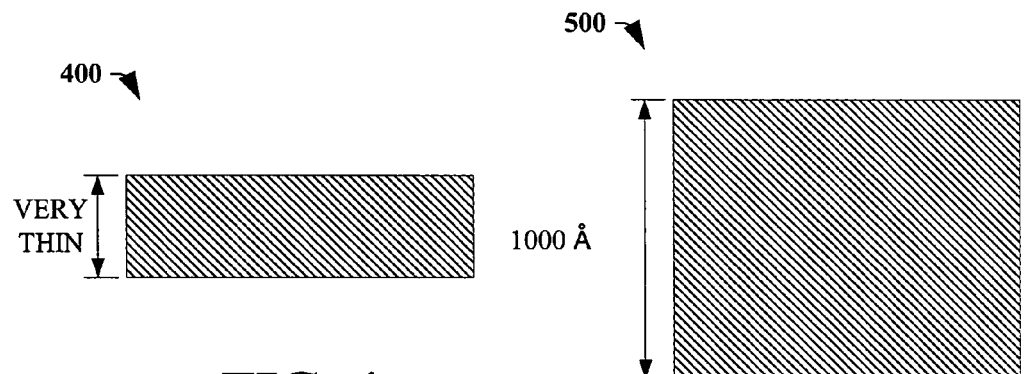
FIG. 4
FIG. 5

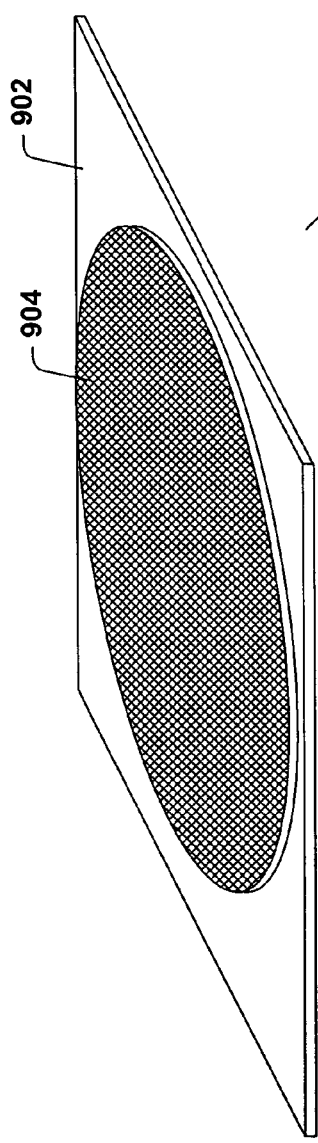
FIG. 17
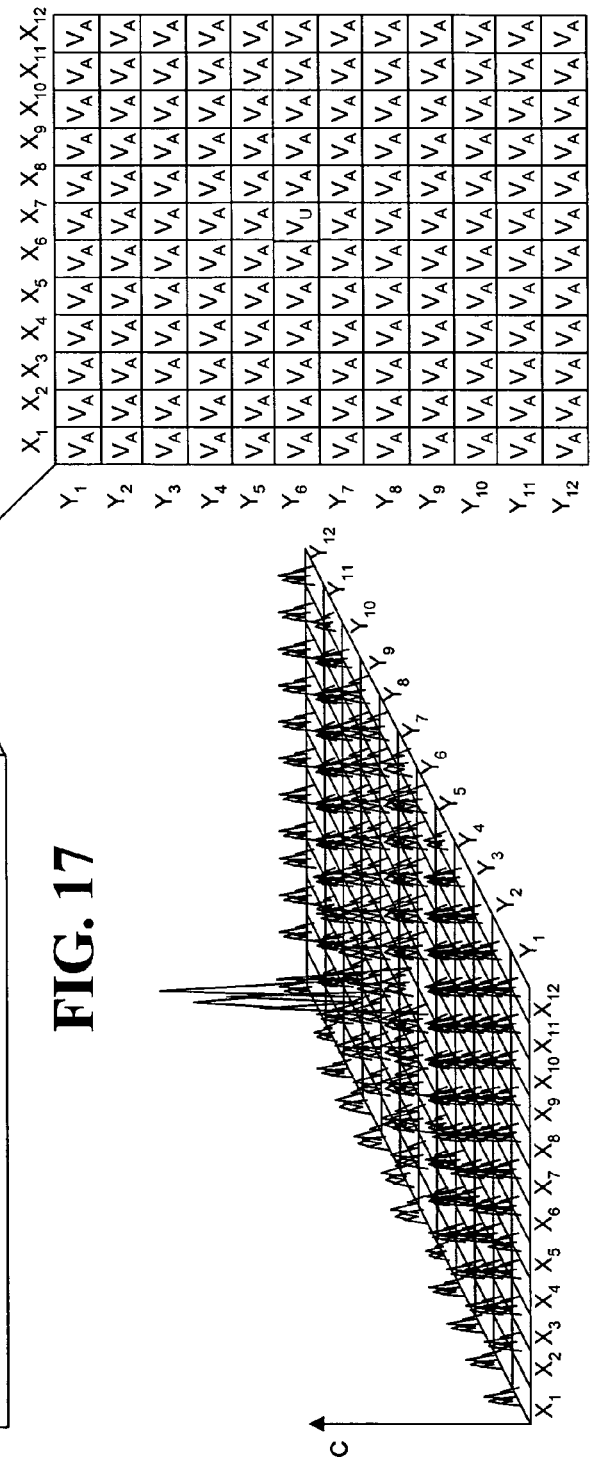
FIG. 19
FIG. 18

DIELECTRIC PATTERN FORMATION FOR ORGANIC ELECTRONIC DEVICES

FIELD OF THE INVENTION

The present invention relates generally to electronic devices employing organic material and, in particular to dielectric patterning of conducting polymers for an electronic component.

BACKGROUND OF THE INVENTION

The volume, use and complexity of computers and electronic devices are continually increasing. Computers consistently become more powerful and new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Traditionally, circuit elements have been electrically isolated primarily through the use of silicon dioxide. Typically, silicon dioxide is not only easy to form through thermal oxidation of silicon or by various deposition methods, but also it is easy to reliably etch through both wet and dry chemistry.

Nonetheless, the dielectric constant of silicon dioxide is relatively high. Such high dielectric is an advantage when silicon dioxide is used, for example, as a gate dielectric. However, it can be a disadvantage, when silicon dioxide is employed to isolate, for example, adjacent metal conductors. Put differently, the relatively high dielectric constant of the silicon dioxide can generally cause capacitive coupling between the metal lines. Such problem is especially pronounced in modern ULSI circuits, where metal lines are formed with very small spaces between them. Generally, these lines can extend for relatively long distances in parallel; such as data or address buses. The capacitive coupling can cause problems with high-speed operation and with data errors due to cross talk between the conductors. To reduce the capacitive coupling between elements in the circuit, while still achieving the essential electrical isolation, new dielectric materials have been developed and introduced into integrated circuit manufacturing. These new materials typically are based on organic compounds that may also contain inorganic elements, such as silicon. For example, spin-on-glass (SOG) materials, such as silsesquioxane have been introduced. Amorphous carbon dielectric materials and organic polymers have also been applied in place of silicon dioxide. These new materials reduce the dielectric constant of the insulating layer formed, thus improving circuit performance.

At the same time, a relatively recent type of memory cell is an organic based memory cell. Organic memory cells are at least partly based on organic materials and, are thus able to overcome some of the limitations of inorganic based memory cells. Organic memory cells facilitate increases in device density, while also increasing device performance relative to conventional inorganic memory cells. Additionally, organic memory cells are non-volatile and, as such; do not require frequent refresh cycles or constant power. Such cells can have two or more states corresponding to various levels of impedance. These states are set by applying a bias voltage, and then the cells remain in their respective states until another voltage, in reverse bias, is applied. The cells maintain their states with or without power (e.g., non-volatile) and can be read either electrically or optically by measuring injection current or light emission, for example.

Typically, dielectric patterning for polymers employed in such memory cells, and/or other organic electronic components, can require a series of steps that results in formation of the dielectric layer over the conducting polymer surface. Generally, the larger the number of steps to produce such dielectric patterning, the higher the associated cost and chances of errors. Such errors can create distorted or misplaced patterns that can result in change in the electrical functioning of an organic memory cell so created.

Therefore, there is a need to overcome the aforementioned deficiencies associated with conventional systems for dielectric patterning.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is merely to present some concepts of the invention in a simplified form as a prelude to the more detailed description that is presented later.

The present invention provides for a methodology and system for patterning and/or etching a non conductive dielectric on a surface of a conductive polymer, e.g. as part of an organic memory cell. Although the present invention is described primarily within the context of fabricating organic memory cells, it is to be appreciated that the present invention may be applied in the fabrication of a wide variety of devices and/or features of electronic devices employing organic material.

According to one aspect of the present invention hydrogen ions created from molecular hydrogen being exposed to short wave length radiation, are employed as mobile positive ion charge carriers to create a non-conductive die-electric pattern and an etch thereof on a conductive and/or semiconductive polymer surface of an organic memory cell. Such process reduces number of masking steps performed. In addition, the process is scalable with lithographic wave length and can be performed on wide spread tool sets and photoresist material available in commercial market.

In a related aspect of the present invention, a polymer surface with an associated photo resist mask is radiated with short wave length radiation in the presence of dilute amounts of hydrogen in an inert gas. The short wave radiation can include, for example, UV light and X-ray sources. Initially, a photo resist mask is being positioned in a close proximity to the polymer surface, so as to minimize formation of atomic hydrogen species and/or ions in a space beneath the mask during subsequent short wave radiation.

Next, the surface of the polymer is subject to radiation via a short wave length source. The radiated energy can excite the molecular hydrogen gas to create atomic hydrogen species capable of transforming the initially conductive exposed are not covered by the mask, to a non-conductive dielectric. As such, the exposed area of the polymer becomes hydrogen saturated, and a non conductive dielectric pattern can be etched on the polymer surface.

By positioning the mask in substantial proximity to the polymer surface and controlling incidental refractions, covered areas by the mask will retain their conductive feature, as little or no hydrogenation process occurs within a space beneath the mask in covered regions. Accordingly, desired non conductive patterns are formed on the polymer surface. According to one aspect of the invention, such formed dielectric patterns can then be etched at desired locations. Moreover, formation of dielectric patterns can be in-situ monitored and the process controlled, via for example employing various optical interference, scatterometry, IR spectroscopy, ellipsometry, scanning electron microscopy, synchrotron and x-ray diffraction based techniques.

In a related aspect of the present invention, an organic memory cell formed with such process can include a top electrode formed over a dielectric patterned polymer layer, a conductive layer under the polymer layer, a via defined by a dielectric material and located above the top electrode, and a wordline over the dielectric material such that the top electrode is connected to the wordline by way of the via.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

BRIEF DESCRIPTION OF THE DRAWINGS

FIG. 2 is a block diagram of a passive layer that can be employed in an organic memory device in accordance with an aspect of the present invention.

FIG. 3 is a block diagram illustrating an organic polymer layer formed by a CVD process in accordance with an aspect of the present invention.

FIG. 4 is a block diagram illustrating another organic polymer layer formed by a CVD process in accordance with an aspect of the present invention.

FIG. 5 is a block diagram of yet another organic polymer layer formed by a CVD process in accordance with an aspect of the present invention.

FIG. 17 illustrates a perspective view of a grid mapped surface of a wafer according to one or more aspects of the present invention.

FIG. 18 illustrates lots of measurements taken at grid mapped locations on a wafer in accordance with one or more aspect of the present invention.

FIG. 19 illustrates a table containing entries corresponding to measurements taken at respective grid mapped locations on a wafer in accordance with one or more aspects of the present invention.

DETAILED DESCRIPTION OF THE INVENTION

Figure 1A:
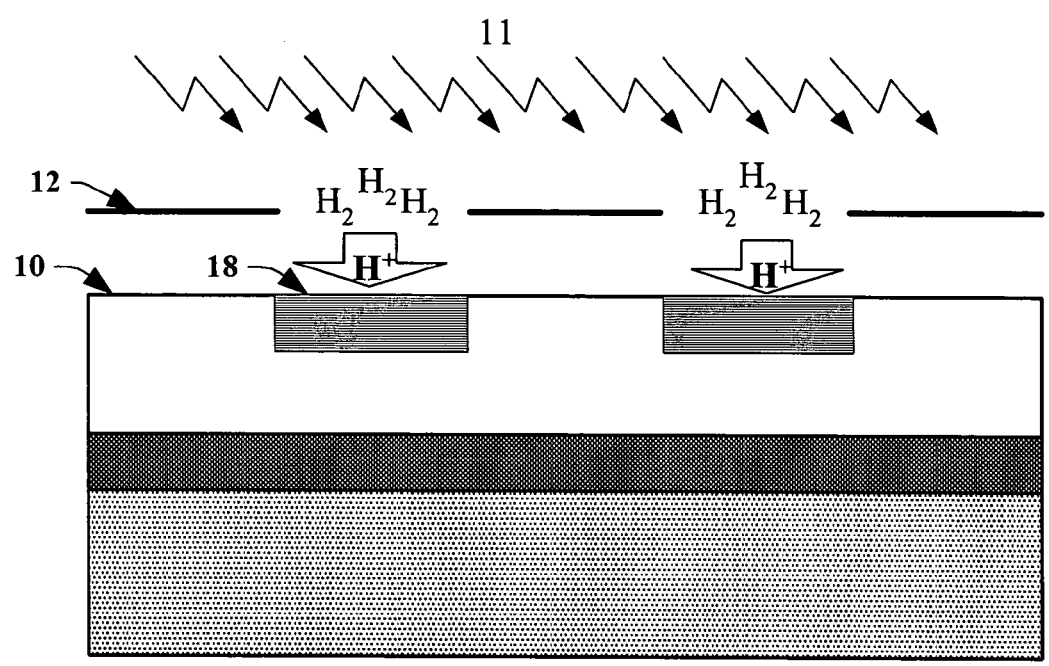
FIG. 1(a) illustrates a dielectric pattern formation according to one or more aspects of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

A dielectric pattern formation according to one aspect of the present invention is represented in FIG. 1(a). A conducting polymer surface 10, which can be part of a memory cell as described infra is being covered by mask 12 and subject to radiation 11 in the presence of dilute amount of hydrogen (e.g. 5% hydrogen), in an inert gas such as; Helium, Neon, Argon, Krypton and Xenon. The radiation source can be capable of producing short wave radiation, as employed in fine patterning techniques; (e.g., <0.25 $\mu$m, UV light and X-rays.) Sources of radiation can include KrF excimer lasers having a wavelength of about 248 nm, a XeHg vapor lamp having a wavelength from about 200 nm to about 250 nm, mercury-xenon are lamps having a wavelength of about 248 nm, an ArF excimer laser having a wavelength of about 193 nm, an $F_2$ excimer laser having a wavelength of about 157 nm, and EUV having a wavelength of about 15 nm to about 10 nm, and as low as 4 nm.

Such radiation can carry sufficient energy to cause transformation of molecular hydrogen gas into atomic hydrogen species. Subsequently, the resulting mobile positive ion charge carriers can interact with exposed surface area not covered by mask 12 and create a dielectric formation 18. Depth of such dielectric formation 18 can be controlled, for example via duration of exposure to atomic hydrogen species, wavelength of radiation, number of positive hydrogen ions and the like.

In a related aspect of the present invention, mask 12 can be positioned in a suitable position relative to the polymer surface 10 such that formation of atomic hydrogen species and/or ions in a space beneath the mask is mitigated and/or eliminated. Positive or negative masks may be employed in the methods of the present invention. The methodology of the present invention is scalable with lithographic wave length and can be performed on wide spread tool sets and photoresist material available in commercial market. The present invention provides for achieving critical dielectric feature dimensions at about 0.25 $\mu$m or less, including about: 1.18 $\mu$m or less; about 0.09 $\mu$m or less; about 0.075 $\mu$m or less; and about 0.05 $\mu$m or less, depending on the wavelength of the radiation used.

Figure 1B:
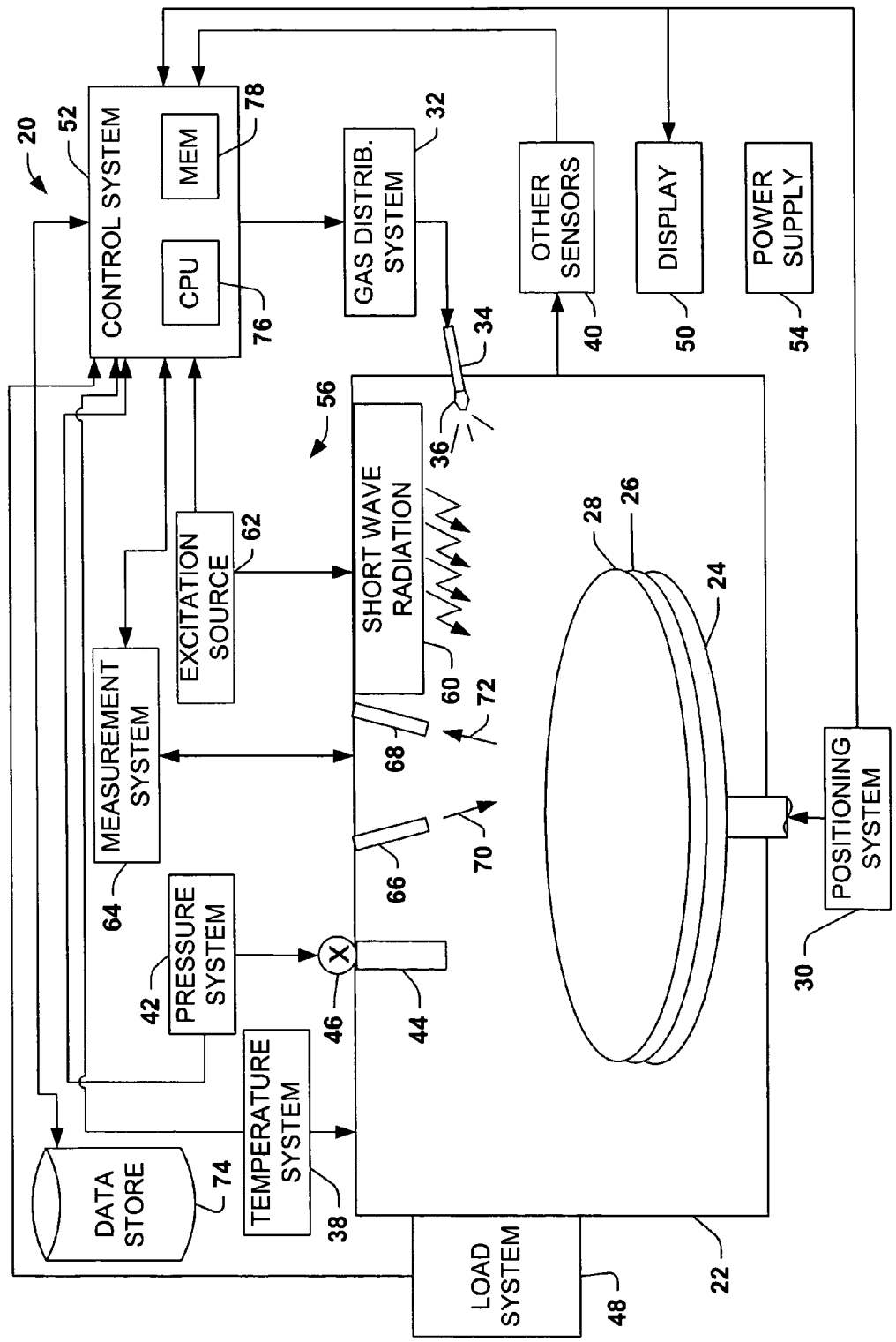
FIG. 1(b) is a schematic block diagram illustrating a system for forming a dielectric pattern on a polymer conductive layer in accordance with one or more aspects of the present invention.
Figure 1C:
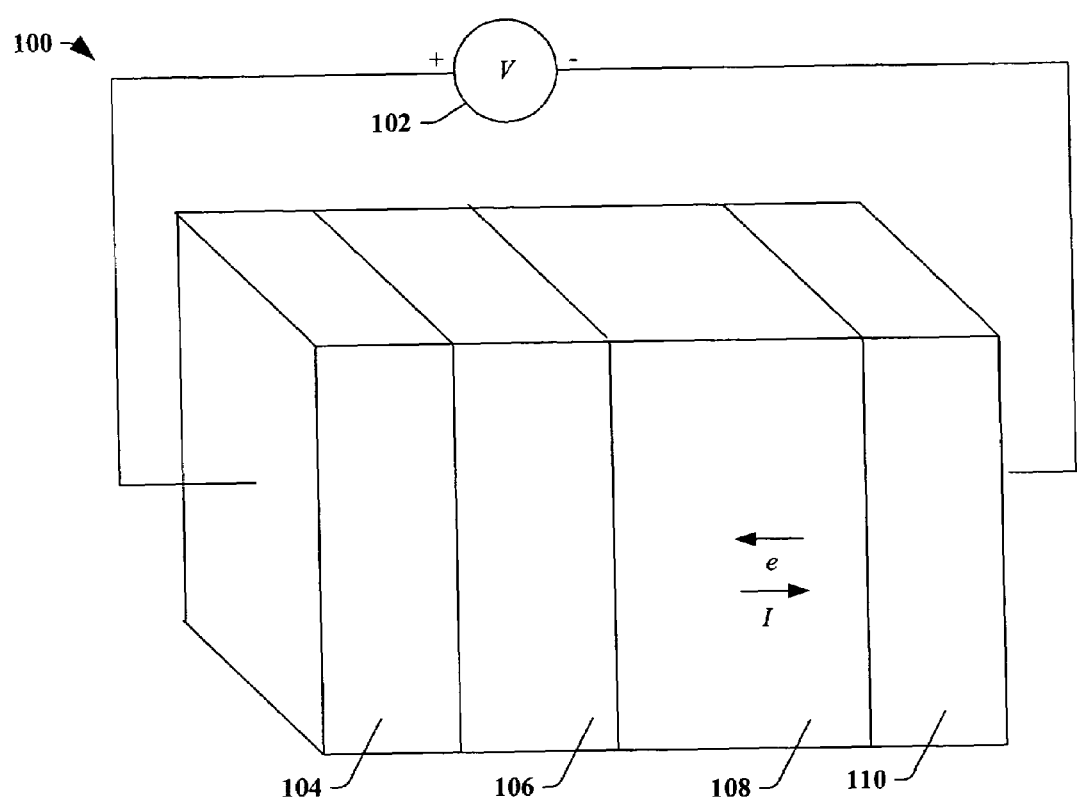
FIG. 1(c) is a perspective diagram of an organic memory device in accordance with an aspect of the present invention.

FIG. 1(b) is a schematic block diagram illustrating a system 20 for forming a dielectric patterning in accordance with or more aspects of the present invention. It will be appreciated that dielectric pattern formation rates may vary in response to factors including, but not limited to, hydrogen gas concentrations, temperatures and/or pressures. The formation described herein can be employed as part of a semiconductor fabrication process wherein one or more memory organic components are produced on a wafer.

The system 20 includes a chamber 22 defined by a housing having a plurality of walls. The chamber 22 includes a support, such as may include a stage 24 (or chuck) operative to support a wafer which includes layer of polymer conductive material 26 upon which a dielectric pattern can be selectively formed via mask 28 with a predetermined pattern, as part of producing one or more organic electronic components, such as memory cells. A positioning system 30 is operatively connected to the support 24 for selectively maneuvering the wafer with conductive polymer layer 26 into desired positions within the chamber 22. It is to be appreciated that any suitable positioning system may be employed in accordance with one or more aspects of the present invention.

A gas distribution system 32 is operatively coupled to the chamber 22 for selectively providing gaseous hydrogen and an inert gas into the chamber at various rates, volumes, concentrations, etc. base upon, among other things, the amount (thickness) of dielectric pattern to be formed, the composition of film(s) to be formed, the pressure within the chamber, the temperature within the chamber and/or the size of the chamber, for example. By way of illustration, the gas distribution system 32 includes one or more sources of gaseous hydrogen medium and inert gases. In the example illustrated, the gases are provided into the chamber through a conduit 34 that terminates in a nozzle 36. While, for purposes of brevity, a single nozzle 36 is shown in FIG. 1(b), it is to be appreciated that more than one nozzle or other gas delivery mechanisms may be utilized to provide gas into the chamber 22 at various mixtures and/or concentrations in accordance with one or more aspects of the present invention. For example, a shower head type gas delivery mechanism can be implemented to more evenly provide hydrogen gas as well as other chemicals into the chamber above the mask 28 and polymer surface 26. The gas distribution system 32 injects a gaseous hydrogen medium into the chamber to function as a medium subjected to subsequent radiation process. A temperature system 38 also is provided for selectively regulating the temperature within the chamber 22. For example, the system 38 may be a diffusion type system (e.g., a horizontal or vertical furnace) operable to diffusion heat into the chamber 22. The temperature system 28 may implement its own temperature control process or such control may be implemented as part of other sensors 40 operatively associated with the etching chamber 22. By way of example, process can be carried out at a relatively low temperature of between about 400 to 600 K. A pressure system 42 is also included in the system to selectively regulate the pressure within the chamber. The pressure system 42 may include, for example, one or more vent conduits 44 having valves 46 that may be controllably opened and/or closed to varying degrees to assist with selectively adapting the pressure within the chamber 22. The formation of dielectric patterning can similarly be performed at a relatively low pressure of between about 0.05 to 0.5 Pa.

The system 20 can also include a load system 48 operatively connected to the chamber 22 for loading and unloading wafers into and out of the etching chamber. The load system 48 typically is automated to load and unload the wafers into the chamber at a controlled rate. The system further may include a display 50 operatively coupled to a control system 52 for displaying a representation (e.g., graphical and/or textual) of one or more operating parameters (e.g., temperature within the chamber, pressure within the chamber, thickness of dielectric pattern formed, chart of rate of dielectric pattern being formed).

A power supply 54 is included to provide operating power to components of the system 20. Any suitable power supply (e.g., battery, line power) suitable for implementation with the present invention can be employed. An excitation system 56 is operatively associated with the chamber 22. The system 56 includes a short wave radiation source 60 and an excitation (e.g., voltage) source 62 wherein the short wave radiation from source 60 excites the hydrogen gas to produce positive ions that interact with exposed areas, not covered by mask 28, of conductive polymer 26.

The system can also include a measurement system 64 for in-situ monitoring of processing within the chamber, such as, for example, thickness of the dielectric pattern film being formed on the polymer conductive layer 26. The monitoring system 64 can be a standalone component and/or can also be distributed between two or more cooperating devices and/or processes. Similarly, the monitoring system 64 can reside in one physical or logical device (e.g., computer, process) and/or be distributed between two or more physical or logical devices. The measurement system 64 includes one or more non-destructive measurement components, such as one employing optical interference, scatterometry, IR spectroscopy, ellipsometry, scanning electron microscopy, synchrotron and/or x-ray diffraction techniques. The measurement system includes a beam source 66 and detector 68.

It is to be appreciated that while one beam source 66 and one beam detector 68 are shown in the example illustrated, more than one of these components may be included to measure film thickness and/or compositions, for example, at various locations on the wafer. The source portion 66 provides one or more beam(s) 70 (e.g., of light from a frequency stabilized laser, laser diode or helium neon (HeNe) gas laser) toward the surface of the conductive layer 26 not covered by mask 28 whereon dielectric pattern is formed. The beam 70 interacts with the formed dielectric pattern and is altered thereby (e.g., reflected, refracted, or diffracted). The altered beam(s) 72 are received at the detector portion 68 of the measurement system 64 and have beam properties (e.g., magnitude, angle, phase, polarization), which can be examined relative to that of the incident beam(s) 70 to determine an indication of one or more properties of the film being deposited (e.g., thickness, chemical species). A plurality of incident beams from one or more sources directed at different spaced apart locations may be employed, for example, to yield corresponding measurements of dielectric film thickness at these locations substantially concurrently during the process. The concurrent measurements, in turn, may provide an indication of pattern formation uniformity and may be useful in controlling the process to efficiently and economically achieve desired results and mitigate the need for and/or degree of subsequent processing steps, such as, for example, selective repeat of the process at particular locations on the surface of the conductive polymer.

With respect to optical interference, for example, the intensity of light over a selected wavelength varies as a function of surface properties (e.g., thickness, chemical composition). For spectroscopic ellipsometry, thickness varies based on the state of polarization of light reflected from the film, which is functionally related to the index of refraction of the material reflecting the beam 72.

Using a scatterometry technique, for example, desired information concerning dielectric film thickness and/or chemical composition can be extracted by comparing the phase and/or intensity (magnitude) of the light directed onto the surface of the film with phase and/or intensity signals of a complex reflected and/or diffracted light resulting from the incident light reflecting from the surface of the film upon which the incident light was directed. The intensity and/or the phase of the reflected and/or diffracted light will change based on properties (e.g., thickness, chemical species) of the dielectric film upon which the light is directed.

Substantially unique intensity/phase signatures can be developed from the complex reflected and/or diffracted light. The measurement system 64 provides information indicative of the measured properties to the control system 52. Such information may be the raw phase and intensity information. Alternatively or additionally, the measurement system 64 may be designed to derive an indication of dielectric film thickness, for example, based on the measured optical properties and provide the control system 52 with a signal indicative of the measured film thickness according to the detected optical properties. The phase and intensity of the reflected light can be measured and plotted to assist with such determinations, such as, for example, by way of derived curve comparisons.

In order to determine dielectric film thickness, for example, measured signal characteristics may be compared with a signal (signature) library of intensity/phase signatures to determine properties of the formed dielectric-products. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N = n - jk,$$ Eq. 1a where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a surface can generate a first phase/intensity signature. Similarly, when exposed to the first incident light of known intensity, wavelength and phase, a second feature on a surface can generate a second phase/intensity signature. For example, a particular type of film having a first thickness may generate a first signature while the same type of film having a different thickness may generate a second signature, which is different from the first signature. Observed signatures can be combined with simulated and modeled signatures to form the signal (signature) library. Simulation and modeling can be employed to produce signatures against which measured phase/intensity signatures can be matched. Simulation, modeling and observed signatures can, for example, be stored in a signal (signature) library or data store 74 containing, for example, thousands of phase/intensity signatures. Such a data store 74 can store data in data structures including, but not limited to one or more lists, arrays, tables, databases, stacks, heaps, linked listed and data cubes. Thus, when the phase/intensity signals are received from scatterometry detecting components, the phase/intensity signals can be pattern matched, for example, to the library of signals to determine whether the signals correspond to a stored signature. Interpolation between the two closest matching signatures further may be employed to discern a more accurate indication of thickness and/or composition from the signatures in the signature library. Alternatively, artificial intelligence techniques may be employed to calculate desired parameters based on the detected optical properties.

It is to be appreciated that the beam 70 illustrated in FIG. 1(b) may be oriented at any angle relative to the surfaces of the wafer with a corresponding detector appropriately positioned for receiving the reflected beam. In addition, more than one beam may be directed toward different locations to measure the respective thickness at such different locations to facilitate a measurement of uniformity or thickness. The thickness of the material being deposited is thus determined based upon the optical properties (e.g., n and k) of emitted and reflected beams 72.

One or more other sensors 40 can also be included to monitor and/or measure selected aspects related to the processing occurring within the chamber (e.g., temperature within the chamber, pressure within the chamber, volume and/or flow rate of gasses being distributed into the chamber). These sensors 40 can provide respective signals to the control system 52 indicative of the aspects sensed thereby. The various other subsystems 32, 38, 42, 56 can further provide respective signals to the control system 52 indicative of operating conditions associated with the respective systems (e.g., degree that vent valve(s) are open, time period(s) that particular valve(s) have been closed). Considering the signals and information received from the measurement system, 64 other sensors 40 and subsystems 32, 38, 42, 56, the control system 52 can discern whether the dielectric patterning process is proceeding as planned. If not, the control system can adapt the process by formulating and selectively providing appropriate control signals to the associated systems 30, 32, 38, 42, 48, 56, to adjust one or more of the systems (e.g., to increase the volume of copper sulfide provided into the chamber and increase the thickness of the layer being deposited).

The control system 52 can include, for example, a processor 76, such as a microprocessor or CPU, coupled to a memory 78. The processor 76 receives measured data from the measuring system 64 and corresponding other data from the other sensors 40 and subsystems 32, 38, 42, 56. The control system 52 can be configured in any suitable manner to control and operate the various components within the system 20 in order to carry out the various functions described herein. The processor 76 can be any of a plurality of processors, and the manner in which the processor 76 can be programmed to carry out the functions relating to the present invention will be readily apparent to those having ordinary skill in the art based on the description provided herein.

The memory 78 included within the control system 52 serves to store, among other things, program code executed by the processor 76 for carrying out operating functions of the system as described herein. The memory 78 may include read only memory (ROM) and random access memory (RAM). The ROM contains among other code the Basic Input-Output System (BIOS) which controls the basic hardware operations of the system 20. The RAM is the main memory into which the operating system and application programs are loaded. The memory 78 also serves as a storage medium for temporarily storing information such as, for example, thickness tables, chemical composition tables, temperature tables, pressure table sand algorithms that may be employed in carrying out one or more aspects of the present invention. The memory 78 can also serve as the data store 74 and can hold patterns against which observed data can be compared as well as other data that may be employed in carrying out the present invention. For mass data storage, the memory 78 may include a hard disk drive.

As a result, the system 20 provides for monitoring aspects associated with the processing occurring within the chamber, such as the thickness of film(s) being deposited, for example. The control system 52 may implemented feedback and/or feed forward process control in response to the monitoring so as to form dielectric patterning on the conductive layer 26 in an efficient and cost effective manner. It will be appreciated that many of the components of the system 20 including the data store can, for example, reside in one physical or logical device (e.g., computer, process) and/or may be distributed between two or more physical or logical devices (e.g., disk drives, tape drives, memory units). Measuring thickness of dielectric matter being formed in-situ and adapting processing in response thereto facilitates dielectric formation at a desired rate, to a desired thickness, with a desired chemical makeup and/or with other desired properties. The dielectric pattern film can, for example, have a thickness between about 200 to 600 nm. In-situ measurement and feedback and/or feed-forward control enhances product yield and improves resulting device performance.

Now referring to FIG. 1(a) a perspective diagram of an organic memory device with its polymer patterned in accordance with an aspect of the present invention is depicted. The memory device includes a first electrode 104, a passive layer 106, an organic polymer layer 108, and a second electrode 110. The diagram also illustrates a voltage source 102 connected to the first electrode 104 and the second electrode 110 that applies a voltage on the first electrode 104 and the second electrode 110.

The first electrode 104 and the second electrode 110 are comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Ivar, Monel®, Inconel®, brass, stainless steel, magnesium-silver alloy, and various other alloys.

The thickness of the first electrode 104 and the second electrode 110 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 108 and the passive layer 106 are collectively referred to as a selectively conductive media or selectively conductive layer. The conductive properties of this media (e.g., conductive, non-conductive, semiconductive) can be modified in a controlled manner by applying various voltages across the media via the electrodes 104 and 110.

The organic layer 108 is comprised of a conjugated organic material, such as a small organic molecule and a conjugated polymer. If the organic layer is polymer, a polymer backbone of the conjugated organic polymer may extend lengthwise between the electrodes 104 and 110 (e.g., generally substantially perpendicular to the inner, facing surfaces of the electrodes 104 and 110). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound.

The organic material may be cyclic or acyclic. For some cases, such as organic polymers, the organic material self assembles between the electrodes during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polystiroles; and the like. Additionally, the properties of the organic material can be modified by doping with a suitable dopant (e.g., salt). A more detailed discussion of the composition of the organic layer 108 is described infra.

The organic layer 108 has a suitable thickness that depends upon the chosen implementations and/or the memory device being fabricated. Some suitable exemplary ranges of thickness for the organic polymer layer 108 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic layer 108 can be formed via a number of suitable techniques. One suitable technique that can be utilized in a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD). It is not typically necessary to functionalize one or more ends of the organic molecule in order to attach it to an electrode/passive layer. Sometime it may have a chemical bond formed between the conjugated organic polymer and the passive layer 106.

The passive layer 106 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 108. The particular conductivity facilitating compound employed is selected so that the two relatively stable states match with the two relatively stable states of the conjugated organic molecule of the layer 108.

The passive layer 106 is operative to transport charge from the first electrode 104 to the interface between the organic layer 108 and the passive layer 106. Additionally, the passive layer 106 facilitates charge carrier (e.g., electrons or holes) injection into the organic layer 108 and increases the concentration of the charge carrier in the organic layer resulting in a modification of the conductivity of the organic layer 108. Furthermore, the passive layer 106 can also store opposite charges in the passive layer 106 in order to balance the total charge of the device 100.

The passive layer 106 can in some instances act as a catalyst when forming the organic layer 108. In this connection, the backbone of the conjugated organic molecule may initially form adjacent the passive layer 106, and grow or assemble away and substantially perpendicular to the passive layer surface. As a result, the backbones of the conjugated organic molecule may be self assigned in a direction that traverses the two electrodes.

Examples of conductivity facilitating compounds that may make up the passive layer 106 include one or more of copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$, $AgS$), iron oxide ($Fe_3O_4$), and the like. The passive layer 106 may be grown using oxidation techniques, formed via gas phase reactions, or deposited between the electrodes.

The passive layer 106 has a suitable thickness that can vary based on the implementation and/or memory device being fabricated. Some examples of suitable thicknesses for the passive layer 106 are as follows: a thickness of about 2 Å or more and about 0.1 μm or less, a thickness of about 10 Å or more and about 0.01 μm or less, and a thickness of about 50 Å or more and about 0.005 μm or less.

In order to facilitate operation of the organic memory device, the organic layer 108 is generally thicker than the passive layer 106. In one aspect, the thickness of the organic layer is from about 0.1 to about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information (e.g., 4 states providing 2 bits of information, 8 states providing 3 bits of information . . . ).

During typical device operation, electrons flow from the second electrode 110 through the selectively conductive media to the first electrode 104 based on a voltage applied to the electrodes by the voltage source 102 if the organic layer is n-type conductor. Alternately, holes flow from the first electrode 104 to second electrode 110 if the organic layer 108 is p-type conductor, or both electrons and holes flow in the organic layer if it can be both n and p type with proper energy band match with 106 and 110. As such, current flows from the first electrode 104 to the second electrode 110 via the selectively conductive media.

Switching the organic memory devices to a particular state is referred to as programming or writing. Programming is accomplished by applying a particular voltage (e.g., 9 volts, 2 volts, 1 volt, and the like) across the selectively conductive media via the electrodes 104 and 110. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on". . . ). The threshold value varies depending upon a number of factors including the identity of the materials that constitute the organic memory device, the thickness of the various layers, and the like. The voltage supply 102 is controllably employed to apply the threshold voltage in this aspect of the invention. However, other aspects of the invention can utilize other means to apply threshold voltages.

Generally speaking, the presence of an external stimuli such as an applied electrode field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 2 volts, 1 volts, 0.5 volts) is applied via the voltage source 102. Then, an impedance measurement is performed which, therein determines which operating state the memory devices is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other numbers of states can provide other binary interpretations. To erase information written into the organic memory device, a negative voltage or a polarity opposite the polarity of the writing signal that exceeds a threshold value is applied.

FIG. 2 is a block diagram that depicts fabrication of a passive layer 200 in accordance with an aspect of the present invention. A $Cu_yS$ layer is formed by a gas phase reaction operation. A first layer 206 is formed that comprises Cu. A second layer 204 is formed on the first layer. The second layer comprises $Cu_yS$ (e.g., $Cu_2S$, CuS or mixture thereof) and has a thickness of about 20 Å or more. A third layer 202 is formed on the second layer 204. The third layer 202 contains $Cu_2O$, and/or CuO and generally has a thickness of about 10 Å or less. It is appreciated that alternate aspects of the invention can employ suitable variations in composition and thickness and still be in accordance with the present invention.

FIG. 3 is a block diagram illustrating an organic layer 300 formed by a chemical vapor deposition (CVD) process in accordance with an aspect of the present invention. The organic layer 300 is formed via a gas phase reaction process. Typically, the organic layer 300 is formed in contact with a passive layer and an electrode. The organic layer 300 is comprised of polymer polydiphenylacetylene (DPA).. This polymer layer, as shown in FIG. 3, is fabricated to be about 65 Å thick.

Turning now to FIG. 4, a block diagram depicting another organic layer 400 formed from a CVD process in accordance with an aspect of the present invention is illustrated. One again, the organic layer 402 is formed via a gas phase reaction process. The organic layer 402 is formed in contact with a passive layer and an electrode. The organic polymer layer 402 is comprised of polymer polyphenylacetylene (PPA). Referring to FIG. 5, a block diagram of another organic layer 500 formed by spin coating in accordance with an aspect of the present invention is illustrated. The organic layer 500 is formed via a spin coating process, instead of a gas phase reaction process. The organic layer 500 is formed in contact with a passive layer and an electrode. The organic layer 500 is comprised substantially of PPA and has a thickness of about 1000 Å.

Experimental results tend to show that organic layers formed via spin coating yield a more reliable polymer layer than polymer layers formed via CVD. This may be due to the presence of oxygen and lack of control of heat generated by polymerization under CVD. It is appreciated that controlling heat and oxygen during polymerization for CVD processes can improve the resulting polymer layer. Additionally, organic layers created via CVD are generally thinner than those created with other methods.

It is appreciated that various alternatives to and variations of the layers described in FIG. 2–5 can be employed in accordance with the present invention.

The passive layer (e.g., CuS) employed in organic memory devices play an important role. Its presence significantly improves the conductivity of the organic layer. This characteristic is at least partially a function of the following: charge carrier generated by CuS, build up of a charge depletion layer, charge carrier distribution in organic material, and memory loss due to charge carrier redistribution after reversing electric field. The discussion infra describes and illustrates charge carrier concentration and models behavior of organic memory devices.

In the following example, conductive polymer is used as organic material, and CuS is used as passive layer material. With respect to charge carrier generation, the copper in CuS is at its highest oxidation state Cu(II). It has relatively strong capability to gain electrons from a conducting polymer and yields the following equation:

$$Cu(II)S + Polymer \rightarrow Cu(I)S^- + Polymer^+ \quad (1)$$

Figure 6:
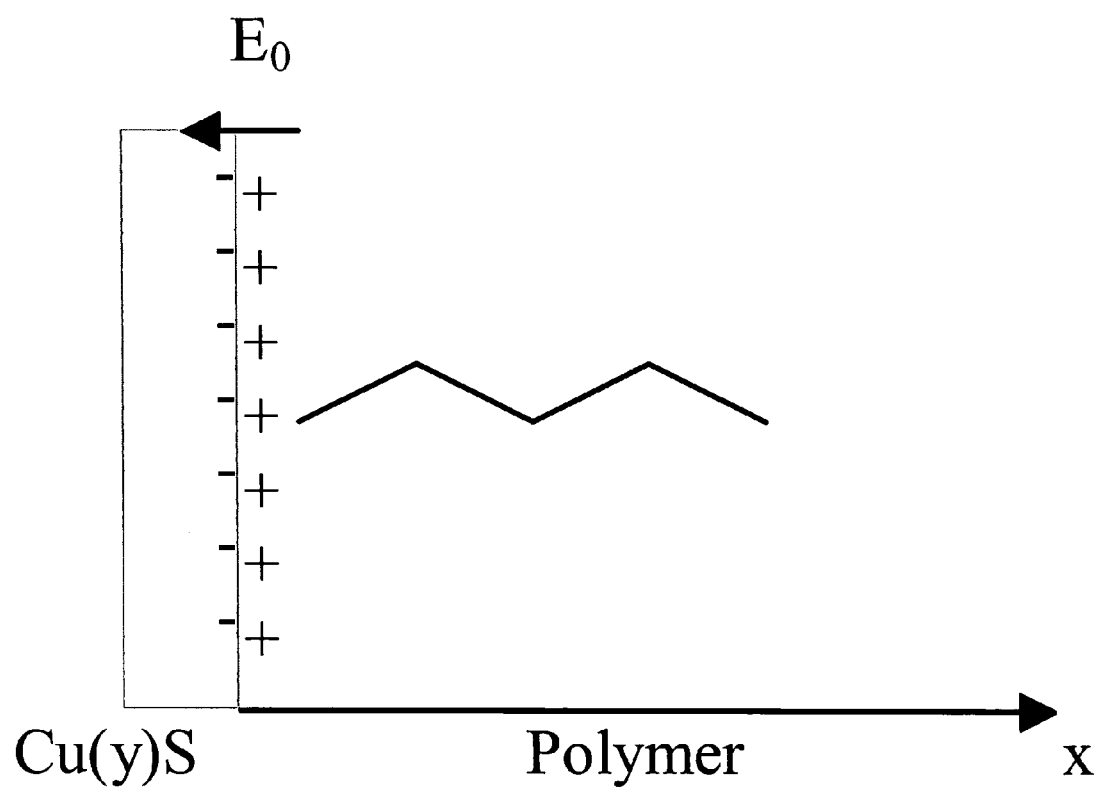
FIG. 6 is a graph depicting the effect of an intrinsic electric field on an interface between a passive layer and an organic polymer layer in accordance with an aspect of the present invention.

The consequence is that an intrinsic field is produced due to the charges accumulated on the interface between CuS and polymer. This is shown in FIG. 6, which is a graph depicting the effect of an intrinsic electric field on an interface Cu(y)S and a polymer is provided. The oxidized polymer (Polymer+) is the charge carrier when external field is applied. The conductivity of polymer is determined by its concentration and its mobility.

$$\sigma = q\,p\,\mu \quad (2)$$

Where q is the charge of the carrier, p is carrier concentration and $\mu$ is the mobility.

Referring now to the charge depletion layer, employing a similar concept as applied with respect to semiconductors, a potential function can be expressed as:

$$V(x) = qN_p(d_p x - x^2/2)/\epsilon \quad (3)$$

where $N_p$ is the average concentration of charge carrier, $\epsilon$ is the dielectric constant of the polymer, and $d_p$ is the width of the charge depletion. $N_p$ can be obtained by employing the following equation:

$$d_p = \left[\frac{2\epsilon(V_b \pm V)}{qN_p}\right]^{1/2} \quad (4)$$

where V is the external field voltage applied. For forward voltage, it is "−" sign. For the reverse voltage, it is "+" sign.

The voltage function of Eq. (3) can be approximated to simplify the derivation.

With respect to charge carrier distribution, like p-doping of a semiconductor, two processes typically take place in the electric field. This flux can be expressed as:

$$J = -qD\frac{dp}{dx} + q\mu p E \quad (5)$$

where D is diffusion constant of the charge carrier, and E is the electric field at x. If there is no current, the carrier distribution is:

$$p(x) = p(0)\exp([(V(0) - V(x))/Vt]) \quad (6)$$

where p(0) is the concentration, V(0) is voltage at the interface respectively, and $V_t = kT/q$.

When forward voltage is so large that the current flux J>0, the analytical equation can be derived for steady state flow with some assumption for the voltage distribution in the cell. Overall, under forward voltage, the charge distribution p(x) is an increase function of x. When reverse voltage is applied, $V(x) > V_0$, the charge concentration is a decrease function of x.

The final characteristic, retention time, refers to the fact that a forward voltage produces more charge carrier and the charge carrier accumulates more on the other end of the passive (CuS) layer (away from the organic polymer). However, this charge carrier concentration will be set back once the voltage is removed, which includes two processes: charge carrier diffusion toward the CuS layer and charge carrier recombination on the interface.

Fick's Law can described the first process, charge carrier diffusion toward the CuS layer.

The charge carrier recombination can be described as follows:

$$Cu(I)S^- + Polymer^+ \rightarrow Cu(II)S + Polymer \quad (7)$$

The retention time is the time required to redistribute the charge carrier to the original state. It is likely that the reaction rate is relatively faster than diffusion rate. Therefore, the retention time can be substantially determined by the diffusion process only.

An exemplary memory cell is considered herein with respect to the equations 1–9 discussed supra and illustrated in FIG. 7–12. The exemplary cell is considered with parameters intrinsic voltage $V_b$=0.02V, equilibrium constant $K_{eq}$=2.17×10$^{-4}$, concentration of CuS and Polymer at interface [Polymer]$_0$=[CuS]$_0$=10$^{23}$/cm$^3$, polymer thickness d=5×10$^{-5}$ cm (0.5 um), and CuS thickness $d_{CuS}$=5×10$^{-7}$ cm (0.005 um). Six typical cases are calculated to illustrate electrical operation of an organic memory device in accordance with an aspect of the present invention.

Figure 7:
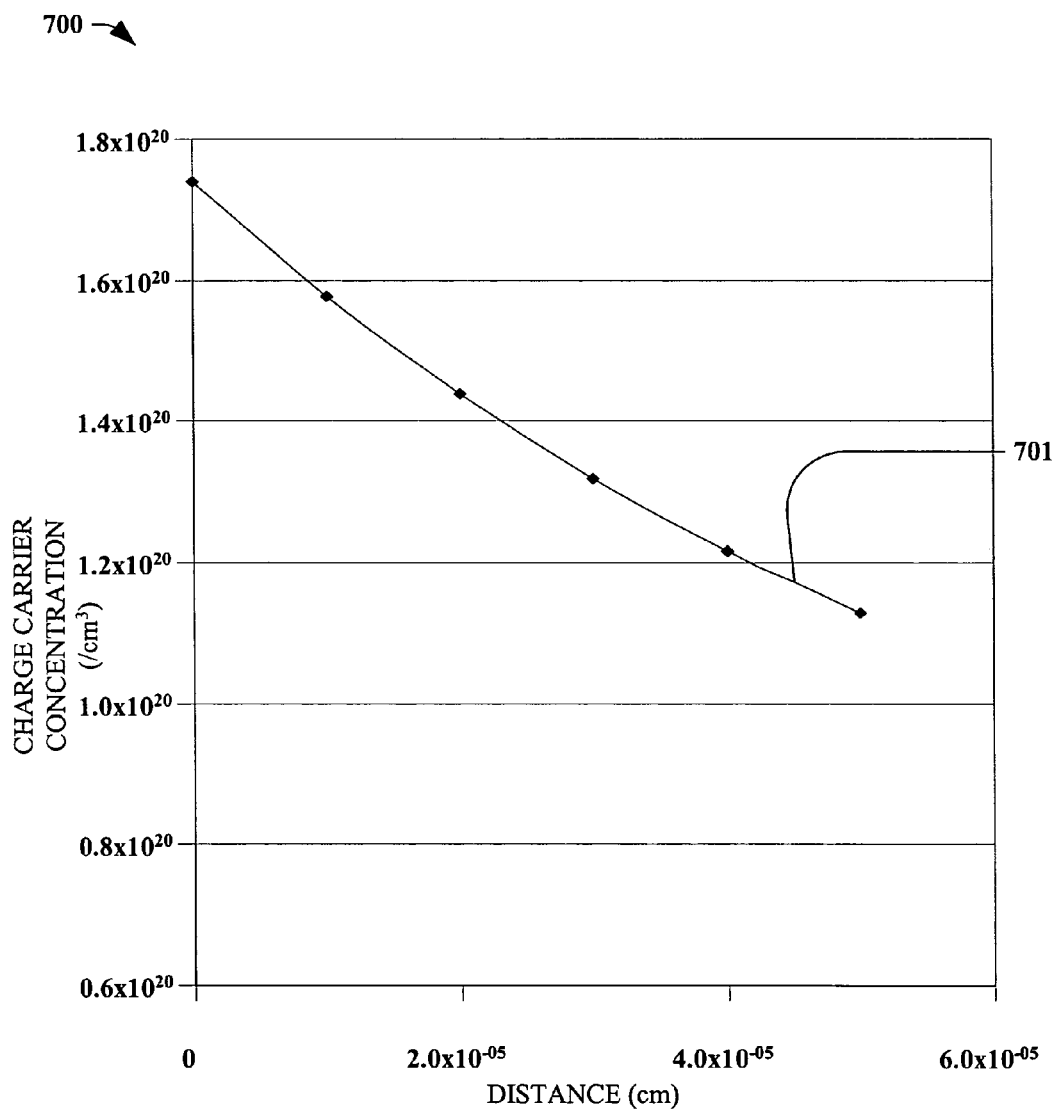
FIG. 7 is a graph illustrating charge carrier distribution of an exemplary memory cell in accordance with an aspect of the present invention.

FIG. 7 depicts a graph 700 of charge carrier distribution 701 of the exemplary memory cell as a function of distance from the CuS and organic polymer interface in accordance with an aspect of the invention. The charge carrier concentration 701 is shown as being a decreasing function of distance (x) from the interface. This graph 700 assumes an external voltage V=0 and a current J=0. The charge carrier concentration 701 is derived utilizing Eq. 6 with a constant field assumption. However, the points shown are independent of the constant field assumption.

Figure 8:
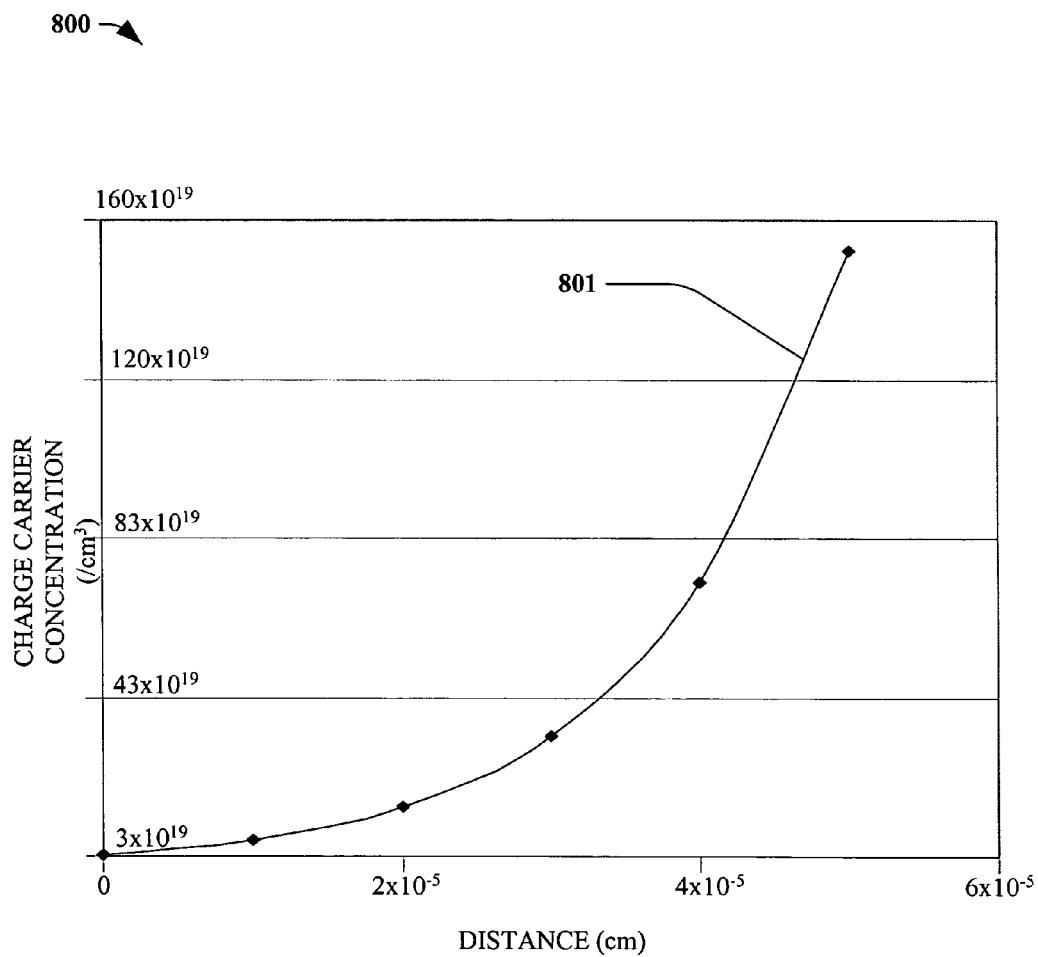
FIG. 8 is a graph illustrating charge carrier distribution of an exemplary memory cell in accordance with an aspect of the present invention.

Turning now to FIG. 8, another graph 800 illustrating charge carrier distribution 801 for the exemplary organic memory cell is depicted in accordance with an aspect of the present invention. For this graph 800, parameters are set as follows: forward voltage=0.12V and current flux J=0. The CuS end has a higher voltage than the other end (organic polymer). this drives the charge carrier away from CuS layer and leads to charge carrier concentration that has an increase function of x. Even at lowest concentration p(0), it is not a small value for this case (e.g., its value is 3.32×10$^{19}$/cm$^3$ for the case shown in FIG. 8). This explains way the polymer is a good conductor when forward voltage is applied. Again, it is Eq. 6 with constant electric field model used for the plot. The points demonstrated are independent of constant electric field assumption.

Figure 9:
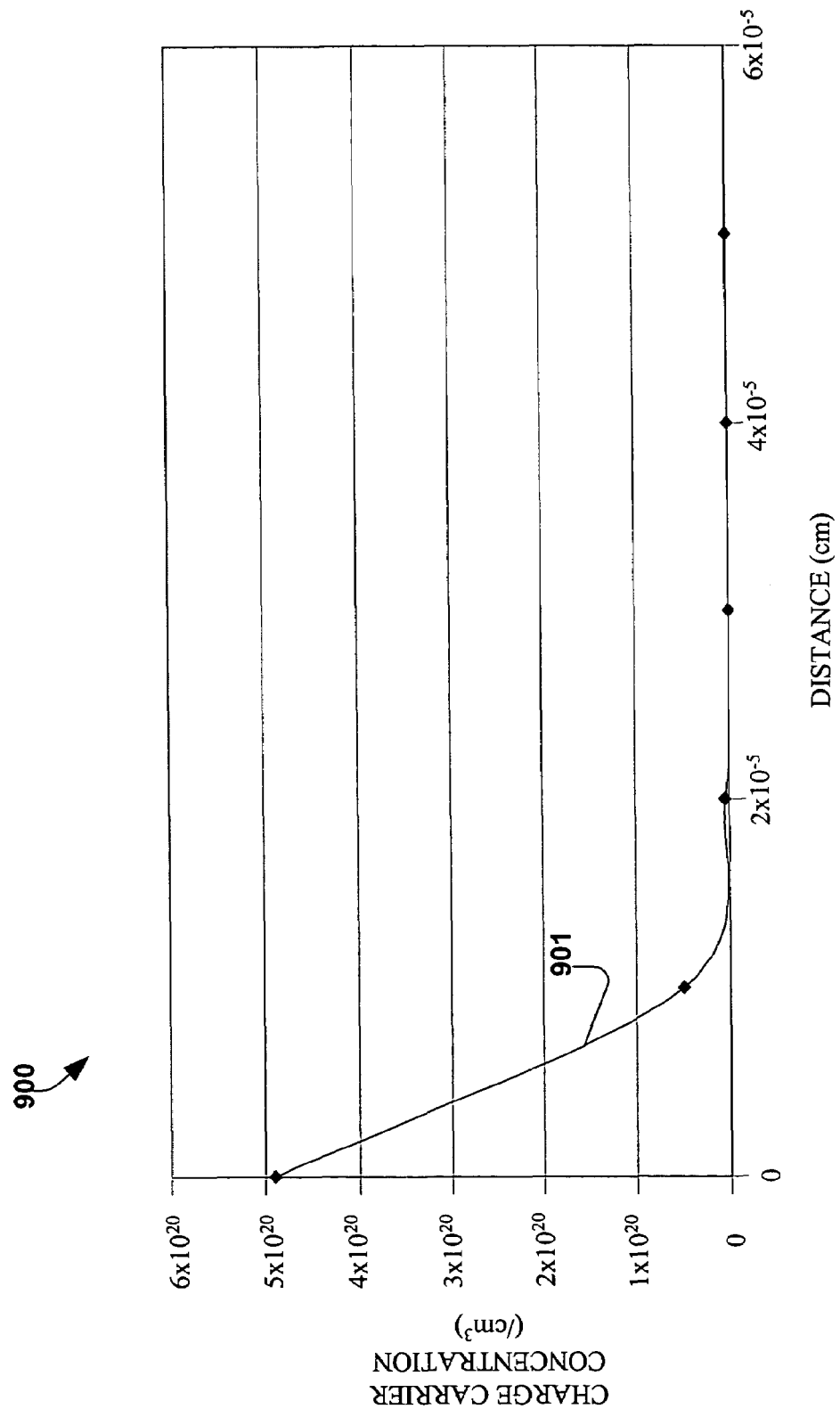
FIG. 9 is a graph illustrating charge carrier distribution of an exemplary memory cell in accordance with an aspect of the present invention.

FIG. 9 depicts yet another graph 900 of charge carrier distribution 901 of the exemplary memory cells as a function of distance from the CuS and organic polymer interface in accordance with an aspect of the invention. For this graph, the parameters are set such that the reverse voltage=0.28V and the current J=0. With reversed voltage, the charge carrier is concentrated at the CuS polymer interface and drops quickly to small concentration when it is away from the interface, which describes why the organic memory cell becomes non-conductive when high reversed voltage applied. Again, Eq. 6 with constant electric field model is assumed for the plot. The points demonstrated are independent of this assumption.

Figure 10:
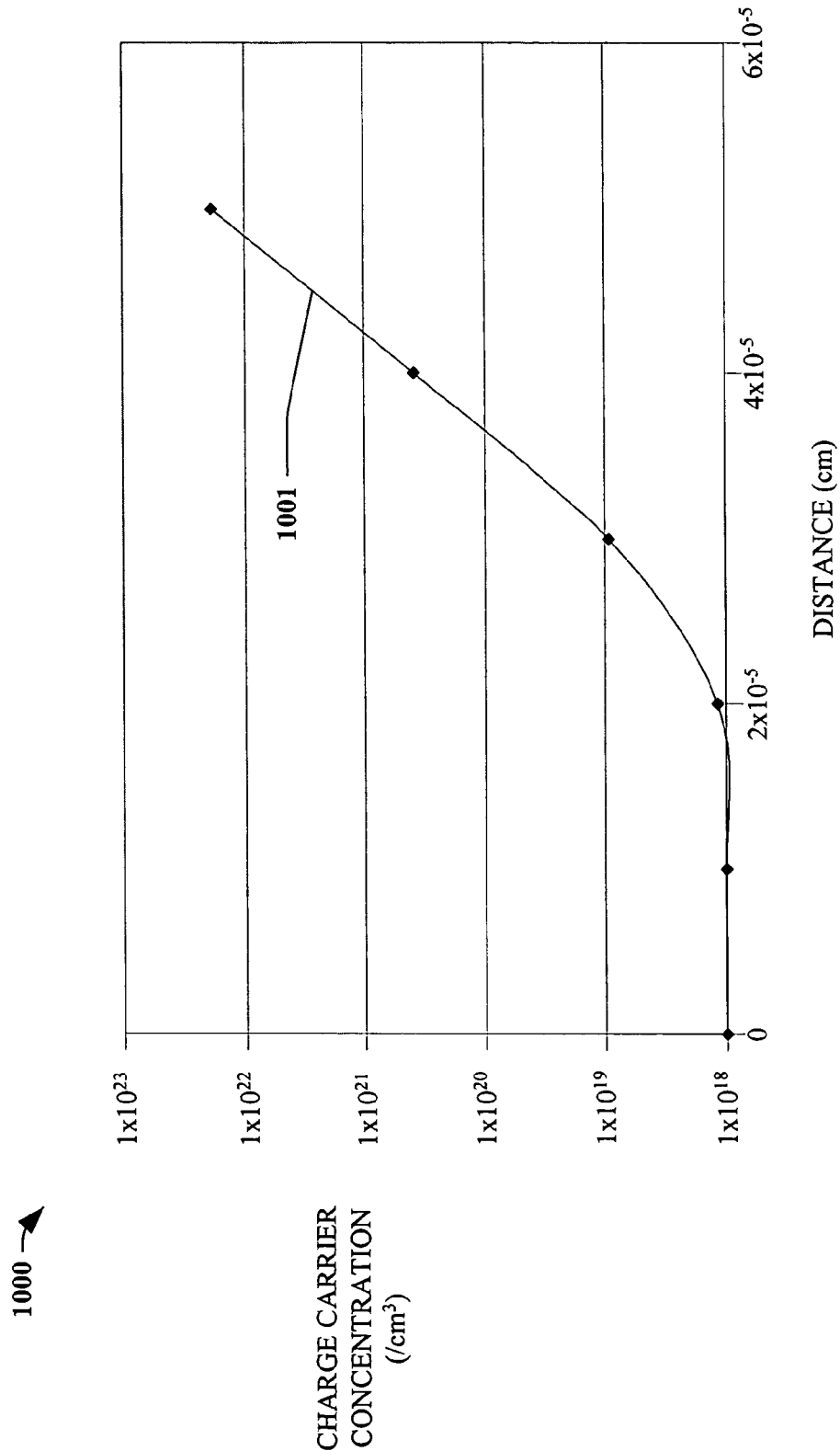
FIG. 10 is a graph illustrating charge carrier distribution of an exemplary memory cell in accordance with an aspect of the present invention.

Referring now to FIG. 10, another graph 1000 that depicts charge carrier distribution 1001 of the exemplary memory cell as a function of distance in accordance with an aspect of the present invention is provided. For this graph 1000, parameters are set as follows: forward voltage=0.52V and current flux J>0 ($p_j$=10$^{18}$/cm$^3$). When current flux J>0, the charge carrier is still an increase function of x because the forward voltage drives the charge carrier away from CuS interface. One important point is that the lowest concentration p(x) is at interface.

Figure 11:
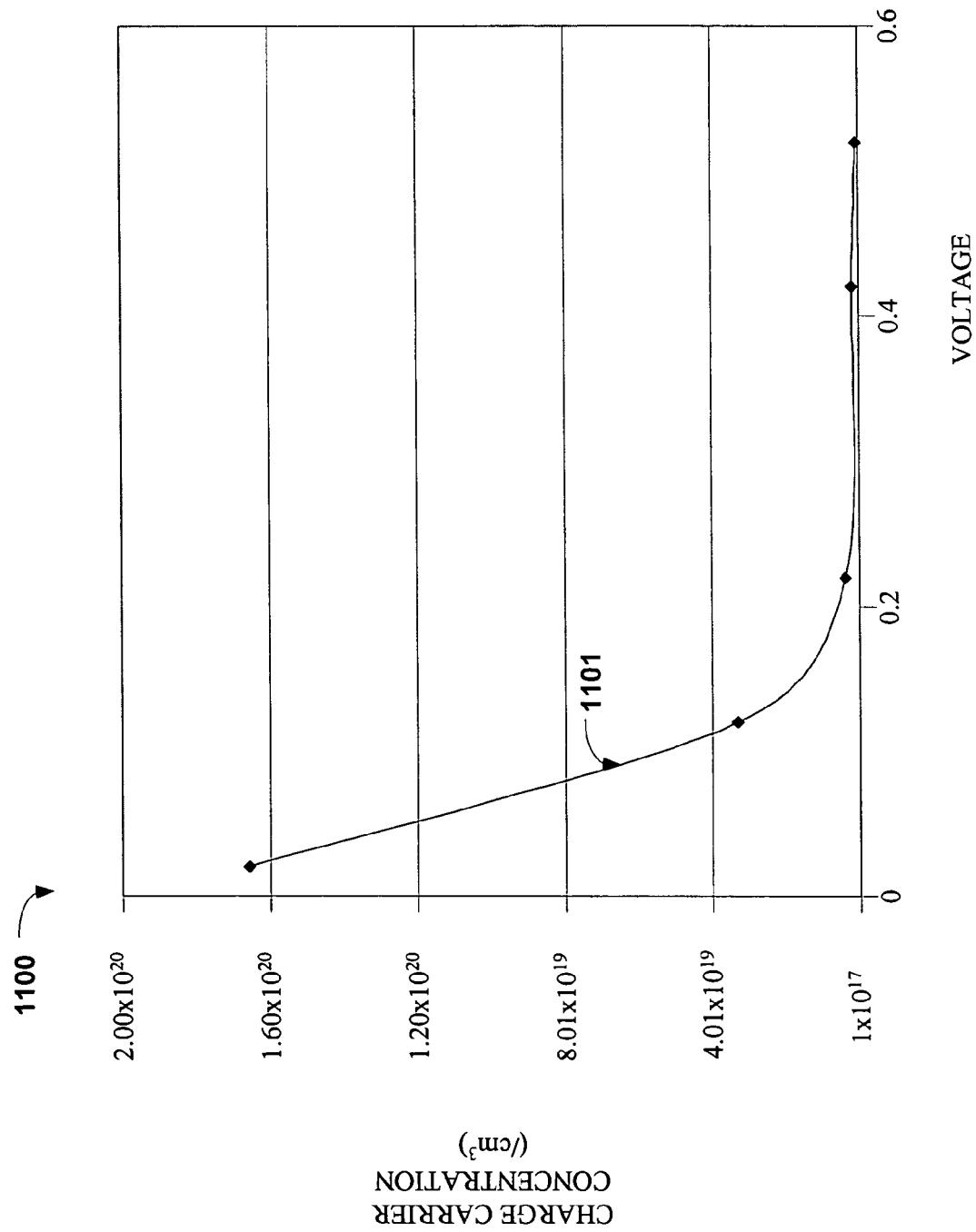
FIG. 11 is a graph illustrating charge carrier concentration at the interface of an exemplary memory cell in accordance with an aspect of the present invention.

FIG. 11 depicts yet another graph 1100 of charge carrier concentration at interface 1101 of the exemplary memory cell as function of forward voltage V. For this graph, the parameters are set such that J>0 ($p_j$=10$^{18}$/cm$^3$) and assumes a constant electric field model. This model assumes the electric field in the cell is constant. Therefore, the voltage V(x) is described as a linear function. This model is applicable when the diffusion constant of the polymer is small and there is constant electric resistance. With this model, the charge carrier concentration at interface is derived as function of voltage. It is noted that $p_0$(V) tends to be constant after forward voltage is large enough and the current is controlled by the charge carrier not charge injection at the interface. As such, p(0) can be rewritten as:

$$p(0) = \frac{1}{2}\left\{-K_{eq}[\text{Polymer}]_0 + \sqrt{(K_{eq}[\text{Polymer}]_0)^2 + \frac{4d_{CuS}K_{eq}[\text{Polymer}]_0[\text{CuS}]_0}{d}}\right\} \quad (10)$$

This Eq. 10 shows that limiting p(0) is an increase function of thickness ratio between CuS layer and polymer layer.

Figure 12:
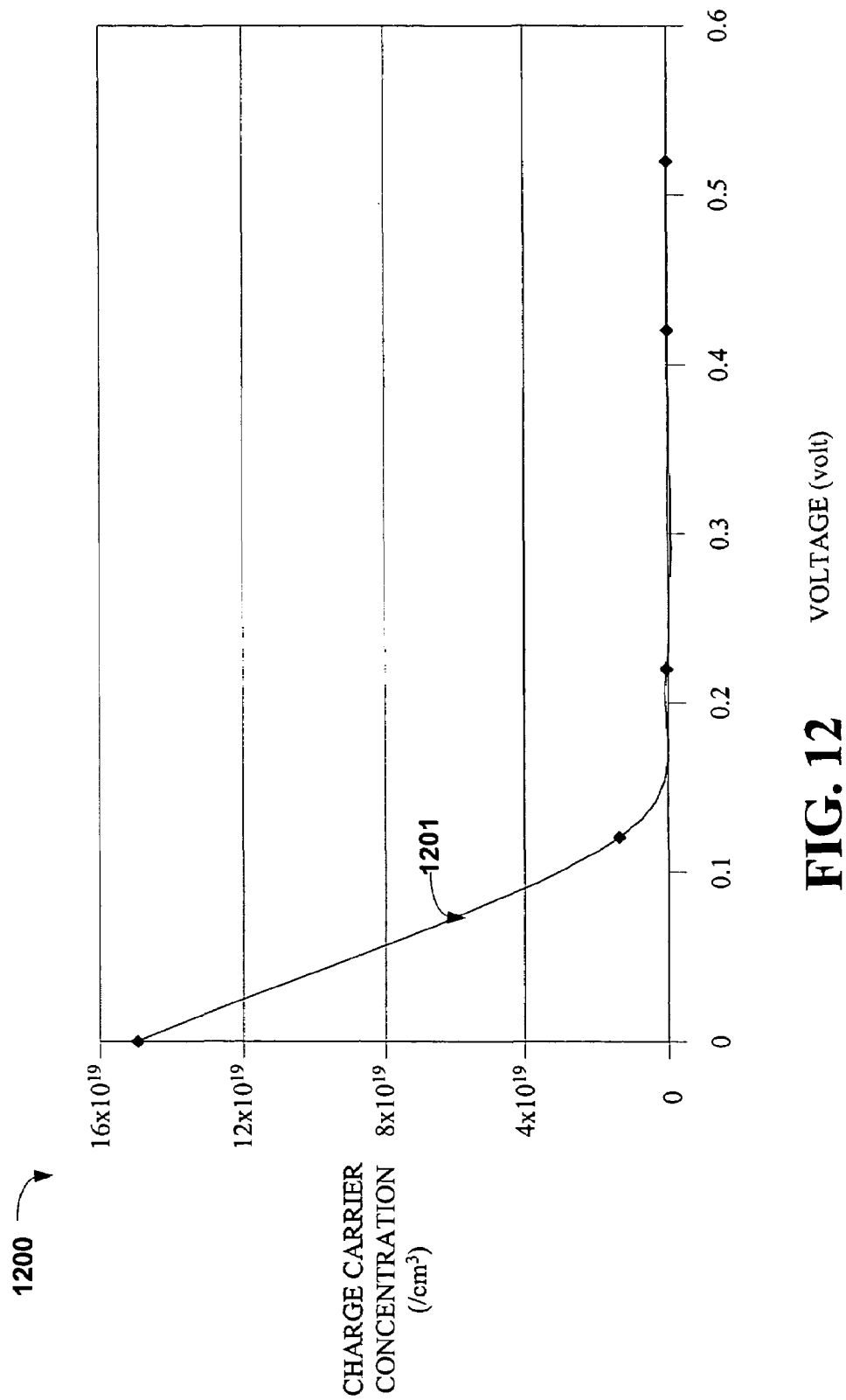
FIG. 12 is a graph illustrating charge carrier concentration at the interface of an exemplary memory cell in accordance with an aspect of the present invention.

FIG. 12 illustrates another graph 1200 that depicts charge carrier concentration at the interface 1201 of the exemplary memory cell as function of forward voltage Vin accordance with an aspect of the present invention is provided. For this graph 1200, p(0) is a function of forward voltage, current J, which may or may not be >0, and a step potential function model. This model assumes the voltage V(x) function can be described by a step function. The model is applicable when the diffusion constant of the polymer is very large. Therefore, the electric resistance in the cell is trivial. With this model, the charge carrier concentration at interface is derived as the function of voltage. It is noted that in FIG. 12 that $p_0$(V) tends to be zero after forward voltage is large enough. When the charge carrier at the interface controls the current flux, this value is a function of voltage. This zero limit behavior is due to the interface boundary limit set by the reaction (1). Basically, the fast charge carrier transportation from the interface to the other end reaches the supply limit. Thus, the limiting p(0) is also rewritten as:

$$p(0) = \frac{1}{2}\left\{-K_{eq}[\text{Polymer}]_0 + \sqrt{(K_{eq}[\text{Polymer}]_0)^2 + \frac{4d_{CuS}K_{eq}[\text{Polymer}]_0[\text{CuS}]_0}{d\left[\exp\frac{V(0)-V}{V_t} - \frac{V(0)-V}{V_t}\right]}}\right\} \quad (11)$$

Again p(0) is an increase function of thickness ratio between CuS layer and polymer layer.

Regarding the above discussion, it is important to note that the flux measured is determined by charge carrier drift when limiting flux is in the polymer. Under constant electric field assumption, the function to describe the charge carrier concentration is p(x). $p_j$=p(0) is met when the polymer determines limiting flux since the lowest concentration in the cell is at the interface. This condition results in a constant p(x). This means the diffusion contribution to the flux in Eq. 5 is zero. Under step potential assumption, another function is employed to described the charge carrier concentration p(x). The initial charge carrier concentration p(0) has a relatively substantially smaller value than other regions. Therefore, J is still determined by p(0). Another point that is noted regards boundary conditions. Unlike semiconductors, it is just applicable to the concentration at interface, not everywhere. This boundary condition limits the total amount of the charge carrier produced in the cell.

The equations supra (e.q. 1–7) and the FIGS. 9–12 described and model behavior of organic memory devices.

This model can be employed to explain measured data and can be for other passive layer materials aside from CuS. Additionally, the model can be used to think about how to improve retention and response time and to design the other devices such as transistor. Further, the model can be employed to develop various threshold voltages that set conductivity levels (e.g., set states), read conductivity levels and erase the conductivity levels thus performing memory device operations of writing or programming, reading and erasing.

Figure 13:
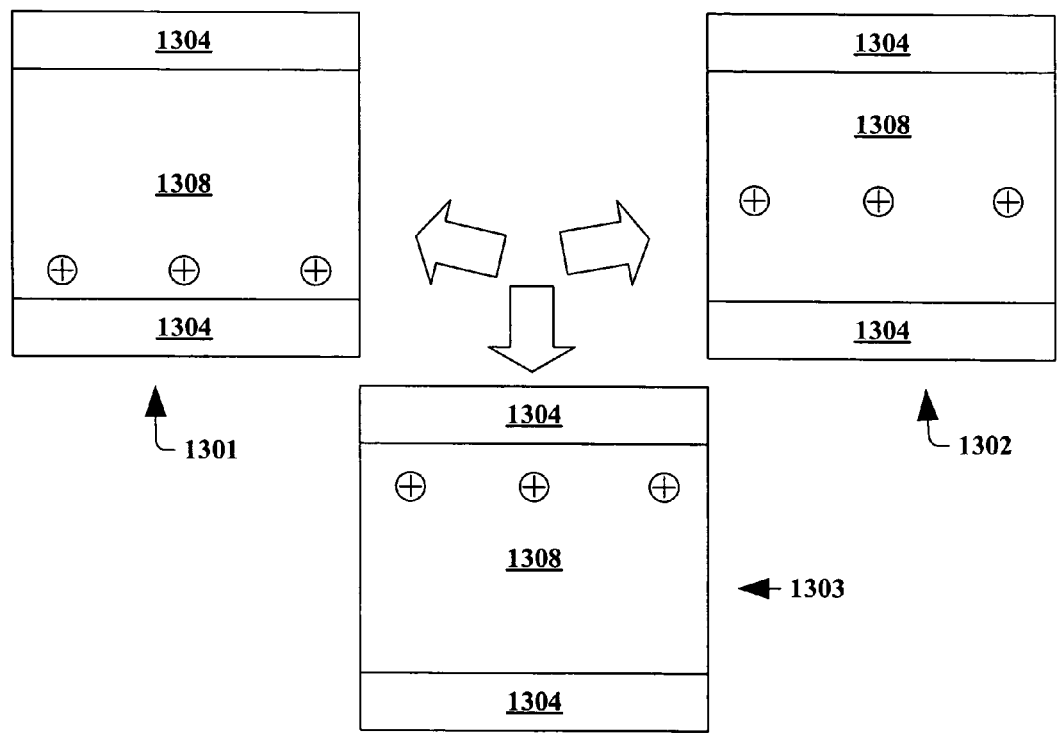
FIG. 13 is a block diagram depicting an organic memory device in various states in accordance with an aspect of the present invention.

FIG. 13 is a block diagram that illustrates an organic memory device 1300 in various states in accordance with an aspect of the present invention. The device 1300 is depicted in a first "off" state 1301, and "on" state 1302, and a second "off" state 1303. It is appreciated that memory devices formed in accordance with the present invention can have other states than those depicted in FIG. 13. The organic memory device 1300 comprises a top electrode 1304, a bottom electrode 1306 and a selectively conductive layer 1308 comprising an organic layer (e.g., PPA) and at least one passive layer (e.g., CuS).

In the first off state 1301, a positive charge 1310 collects in the selectively conductive layer 1308 near the bottom electrode 1306. In the one state 1302, the positive charge 1310 is uniformly distributed thereby indicating an on state. In the second off state 1303, the positive charge collects in the selectively conductive layer 1308 near the top electrode 1304.

Figure 14:
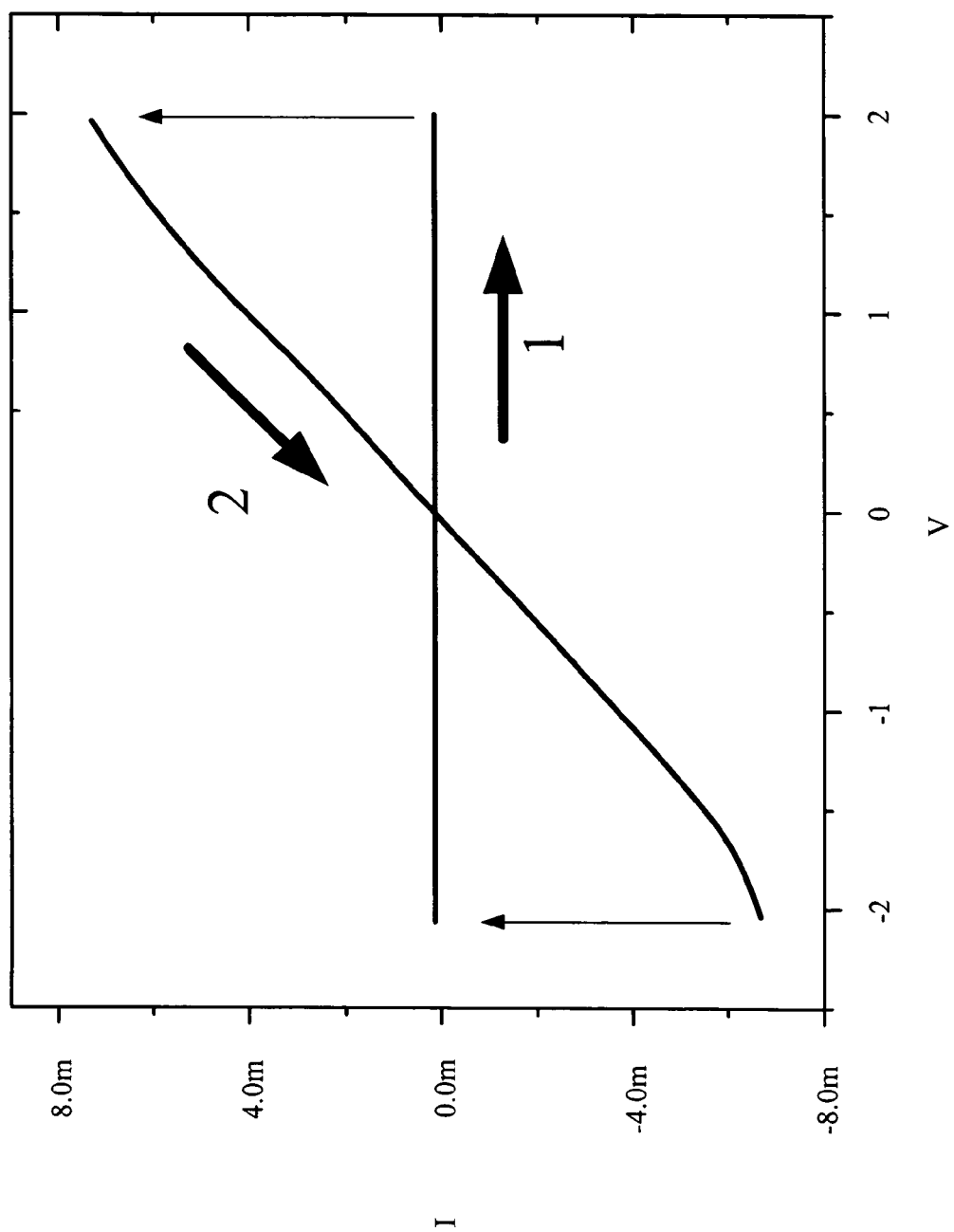
FIG. 14 is a graph illustrating I–V characteristics for an organic memory device in accordance with an aspect of the present invention.

FIG. 14 is a graph 1400 that illustrates I–V characteristics for the memory device 1300 described with respect to FIG. 13. It can be seen that from state 1, which indicates "off", the device can be modified to be in state 2, which indicates "on", by applying a positive voltage of 2V. Additionally, it can be seen that whilst in state 1, the organic memory device has a high impedance and low conductance. Subsequently, the device 1300 can be modified to charge from state 2 to state 1 by application of a negative voltage, therein causing a reverse current until the state 1 is obtained.

Figure 15:
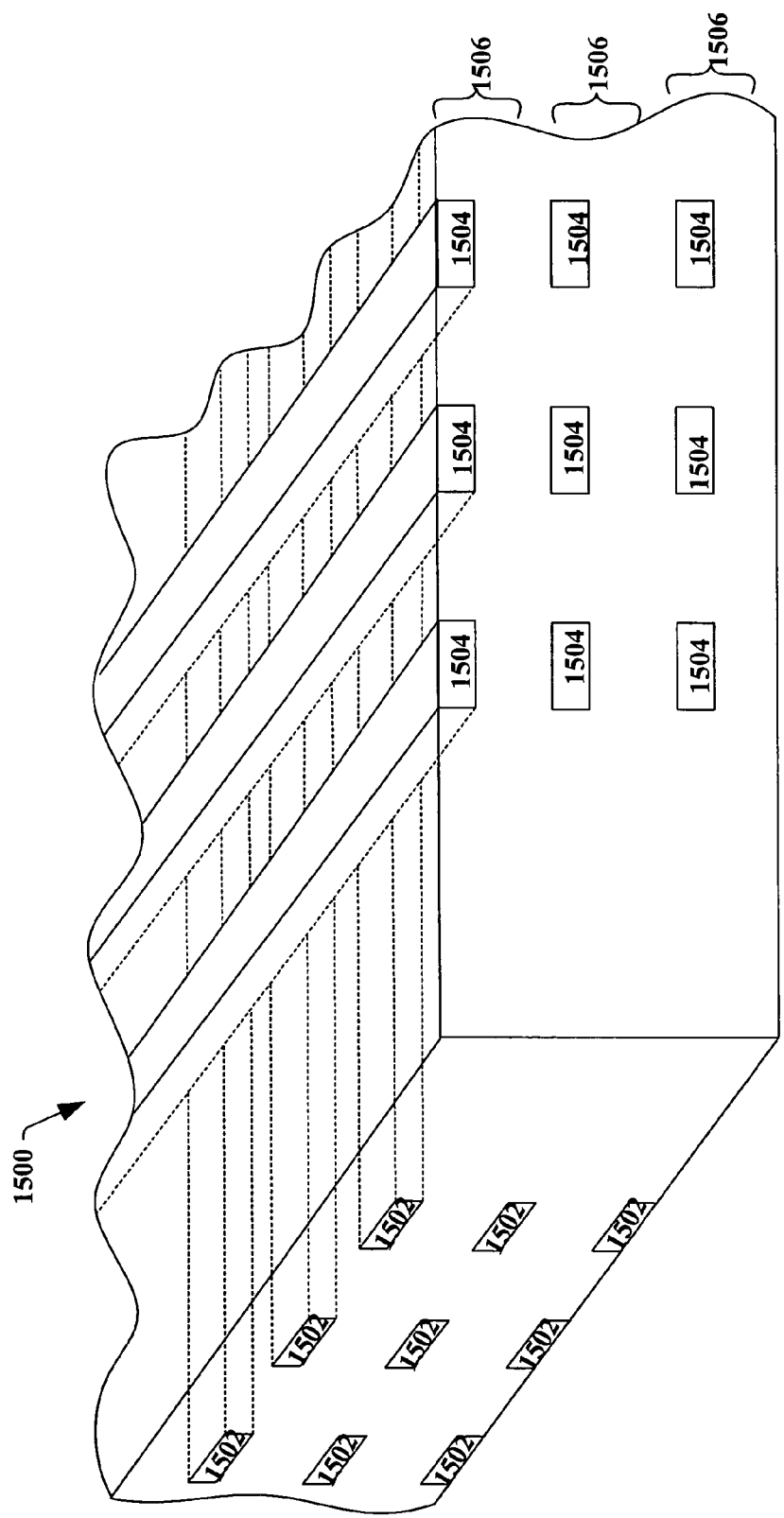
FIG. 15 is a three dimensional view of an organic memory device in accordance with an aspect of the present invention.

Referring to FIG. 15, a three dimensional view of an organic memory device 1500 containing a plurality of organic memory cells in accordance with an aspect of the invention is shown. The organic memory device 1500 contains a plurality of first electrodes 1502, a plurality of second electrodes 1504, and a plurality of memory cell layers 1506. Between the respective first and second electrodes are the controllably conductive media (not shown). The plurality of first electrodes 1502 and the plurality of second electrodes 1504 are shown in substantially perpendicular orientation, although other orientations are possible. The three dimensional microelectronic organic memory device is capable of containing an extremely high number of memory cells thereby improving device density. Peripheral circuitry and devices are not shown for brevity.

The organic memory cells/devices are useful in any device requiring memory. For example, the organic memory devices are useful in computer, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Figure 16:
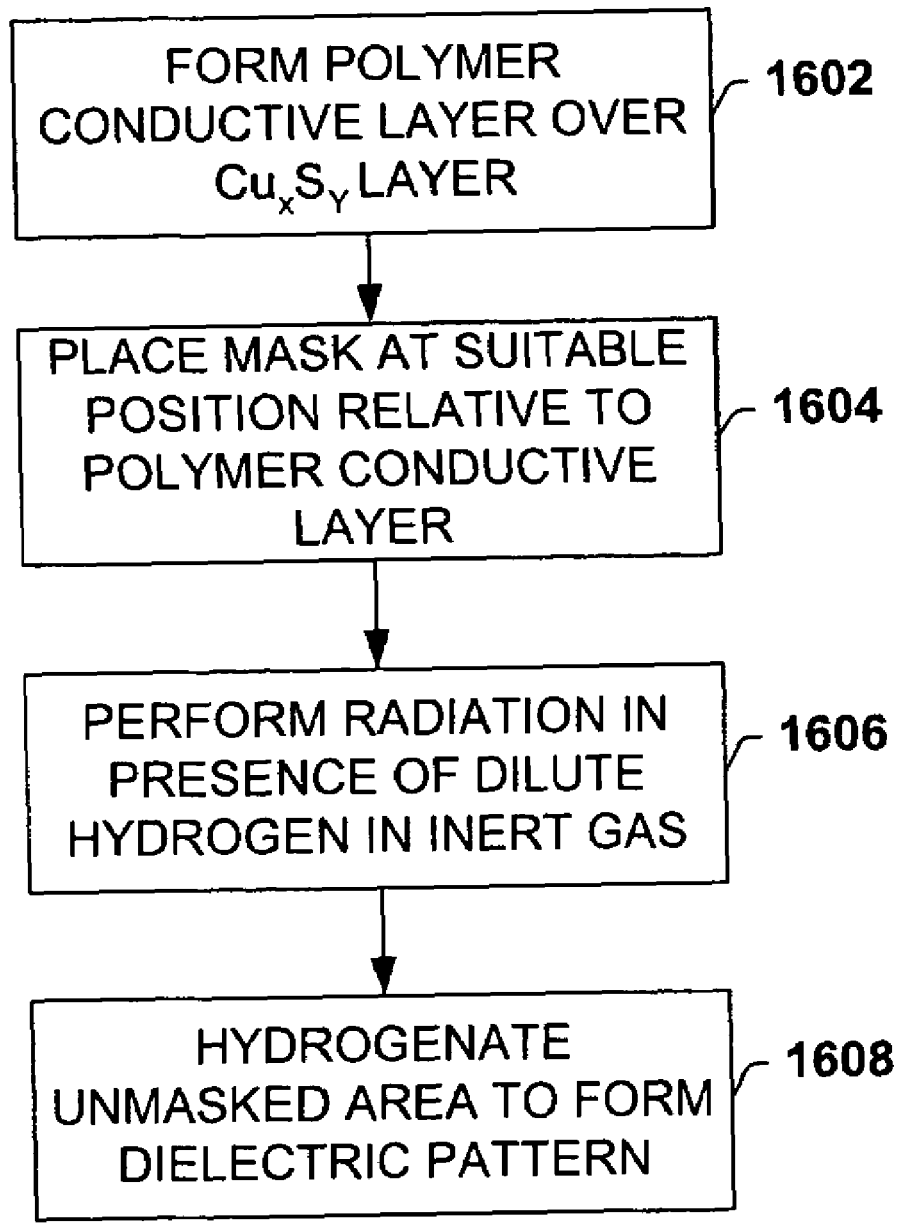
FIG. 16 illustrates a flow chart for a methodology according to the present invention.

FIG. 16 illustrates a methodology according to one aspect of the present invention. While the exemplary method is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. In addition, not all illustrated blocks, events or acts, any be required to implement a methodology in accordance with the present invention. Moreover, it will be appreciated that the exemplary method and other methods according to the invention may be implemented in association with the dielectric patterning illustrated and described herein, as well as in association with other systems and apparatus not illustrated or described.

Initially, at 1602 a conducting polymer is spin coated on the $Cu_xS_y$ layer with a mask placed thereupon and/or in substantial proximity, at 1604. As discussed supra such $Cu_xS_y$ can also be polymerized from vapor phase deposition.

Next, at 1606 the conducting polymer is being exposed to radiation in the presence of Hydrogen molecules in an inert gas. Such radiation can be for example in the form of the conducting polymer and the Hydrogen molecules being irradiated by an extreme ultra-violet (EUV) radiation and/or deep UV radiation source. Such high energy short wave radiation can create positive hydrogen ion charge carriers in gaseous atmosphere, which subsequently inter act with portions of the conducting polymer exposed thereto, as to create a dielectric layer and a respective etch thereof, at 1608. The position of mask relative to the polymer surface is as to minimize radiation diffractions, and formation of hydrogen positive ions in areas covered by the mask. Accordingly, areas not covered by mask are hydrogenated, and form a dielectric pattern at 1608.

Turning now to FIGS. 17–19 a chuck 902 is shown in perspective supporting a wafer having a conductive layer 904 whereupon dielectric material may be selectively formed. The wafer 904 may be logically partitioned into a grid pattern as shown in FIG. 18 to facilitate monitoring dielectric pattern formation on the wafer as it matriculates through a fabrication process. Each grid block (XY) of the grid pattern corresponds to a particular portion of the wafer 904, and each grid block may have one or more memory cells having a respective dielectric pattern formation associated with that grid block. Portions can be individually monitored with one or more innocuous techniques such as, for example, optical interference, scatterometry, IR spectroscopy, ellipsometry, scanning electron microscopy, synchrotron and/or x-ray diffraction for properties including, but not limited to, thickness of copper sulfide deposited, concentration of copper sulfide deposited, etc. This may facilitate selectively determined to what extent, if any, fabrication adjustments are necessary to mitigate problem areas and achieve desired results.

In FIG. 18, respective plots are illustrated for measurements taken at portions of a wafer 904 corresponding to grid mapped locations of the wafer $(X_1Y_1 \ldots X_{12}, Y_{12})$. The plots can, for example, be signatures indicating whether dielectric patterns are forming at an acceptable rate and/or has been formed to a desired thickness. Given the values depicted in FIG. 18, it may be determined that an undesirable condition exists at one or more locations on the wafer 904. For instance, the measurement at coordinate $X_7X_6$ yields a plot that is substantially higher than the respective measurements of the other portions XY. This can indicate, for example, that dielectric material is accumulating too fast at this location.

As such, fabrication components and/or operating parameters associated therewith can be adjusted accordingly to mitigate this condition. For example, the degree that a vent valve is opened can be reduced so that the volume and/or rate of gaseous hydrogen to the process can be restricted. It is to be appreciated that although FIG. 18 illustrates the wafer 904 being mapped (partitioned) into 144 grid block portions, the wafer 904 may be mapped with any suitable number of portions to effect desired monitoring and control.

FIG. 19 illustrates a table of acceptable and unacceptable signature values. As can be seen, all the grid blocks, except grid block $X_7X_6$, have measurement values corresponding to an acceptable value $(V_A)$, while grid block $X_7Y_6$ has an undesired value $(V_U)$. Thus, it has been determined that an undesirable condition exists at the portion of the wafer 904 mapped by grid block $X_7Y_6$. Accordingly, fabrication process components and parameters may be adjusted as described herein to adapt the fabrication process accordingly to mitigate the occurrence or persistence of this condition.

Although the invention has been shown and described with respect to certain illustrates aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

What is claimed is:

1. A method for dielectric patterning comprising:
providing a conductive polymer surface;
positioning a mask over the polymer surface; and
radiating the polymer surface in presence of hydrogen to form positive hydrogen lens that interact with exposed portions of the polymer surface to form a dielectric pattern.

2. The method of claim 1, further comprising positioning the mask in substantial proximity to the polymer surface to mitigate presence of the hydrogen ions in areas covered by the mask.

3. The method of claim 1, radiating the polymer surface further comprising radiating via an x-ray source so as to etch the dielectric pattern.

4. The method of claim 1, radiating the polymer surface further comprising radiating via a UV ray source.

5. The method of claim 1, radiating the polymer surface further comprising radiating via a wave length of less than 300 nm.

6. The method of claim 1, further comprising providing gaseous medium comprising hydrogen and an inert gas.

7. The method of claim 1, further comprising etching portions of the dielectric.

8. A method for fabricating a memory cell comprising:
forming an organic polymer layer over a conductive layer, the conductive layer serving as a bit line;
positioning a mask over the organic polymer layer;
radiating the polymer surface in presence of hydrogen to form positive hydrogen ions that internet with exposed portions of the polymer surface and form a dielectric on the polymer surface, and
forming an electrode layer ever the polymer layer with dielectric patterning.

9. The method of claim 8, forming an organic polymer layer further comprises forming at least one layer from the group consisting essentially of: polyacetylene (cis or trans), polyphenylacetylene (cis or trans), polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, polypyrroles and polydiphenylacetylene.

10. The method of claim 8, forming the electrode layer further comprises forming at least one layer from the group consisting essentially of: amorphous carbon, tantalum, tantalum nitride (TaN), titanium and titanium nitride (TiN).

11. The method of claim 8, further comprising, forming a conductivity facilitating layer over the conductive layer.

12. The method of claim 8, further comprising employing at least one of spin-on techniques, sputtering techniques, growth techniques, deposition techniques, physical vapor deposition (PVD), chemical vapor deposition (CVD), low pressure chemical vapor deposition (LPCVD), plasma enhanced chemical vapor deposition (PECVD), high density chemical vapor deposition (HDCVD), rapid thermal chemical vapor deposition (RTCVD), metal organic chemical vapor deposition (MOCVD) and pulsed laser deposition (PLD).

13. The method of claim 8, forming the organic polymer further comprising forming a layer with a thickness within a range between about 100 Å to 1500 Å.

14. The method of claim 8 further comprising:
measuring at least one of the thickness, rate, composition location and density of the dielectric pattern being formed; and
selectively controlling in response to the measurements at least one of pressure within the chamber, temperature within the chamber, concentration of gases within the chamber, rate of flow of gases into the chamber, volume of gases distributed into the chamber and excitation provided with the chamber.

15. The method of claim 14, further comprising taking measurements via at least one of optical interference, scatterometry, IR spectroscopy, ellipsometry, scanning electron microscopy, synchrotron and x-ray diffraction based techniques.

16. The method of claim 14 further comprising:
mapping the wafer into one or more grids; and
obtaining measurements at the grid mapped locations.

* * * * *